United States Patent [19]
Narahara

[11] Patent Number: 5,453,719
[45] Date of Patent: Sep. 26, 1995

[54] OSCILLATOR CIRCUIT GENERATING OSCILLATION SIGNAL RESPONSIVE TO ONE OF RESONANT ELEMENT AND EXTERNAL CLOCK SIGNAL

[75] Inventor: Tetsuya Narahara, Tokyo, Japan

[73] Assignee: NEC Corporation, Tokyo, Japan

[21] Appl. No.: 335,966

[22] Filed: Nov. 7, 1994

[30] Foreign Application Priority Data

Dec. 17, 1993 [JP] Japan ................... 5-317578

[51] Int. Cl.⁶ ................ H03B 5/06; H03B 5/36
[52] U.S. Cl. .............. 331/49; 331/108 C; 331/116 FE; 331/158; 331/173; 326/58; 327/298
[58] Field of Search .............. 331/49, 56, 108 R, 331/108 C, 111, 116 R, 116 FE, 117 R, 117 FE, 117 D, 158, 161, 172, 173, 179; 326/56, 57, 58, 96, 97; 327/298, 408, 409, 410

[56] References Cited

U.S. PATENT DOCUMENTS

| | | | |
|---|---|---|---|
| 4,551,634 | 11/1985 | Takahashi et al. | 327/408 |
| 4,896,122 | 1/1990 | Tahernia et al. | 331/158 |
| 5,036,215 | 7/1991 | Masleid et al. | 327/410 |
| 5,101,127 | 3/1992 | Simpson | 331/49 X |
| 5,136,185 | 8/1992 | Fleming et al. | 326/56 X |
| 5,140,197 | 8/1992 | Grider | 331/49 X |
| 5,151,613 | 9/1992 | Satou et al. | 331/49 X |
| 5,196,810 | 3/1993 | Graether et al. | 331/49 |

FOREIGN PATENT DOCUMENTS

| | | |
|---|---|---|
| 62-186617 | 8/1987 | Japan . |
| 3274810 | 12/1991 | Japan . |
| 5075342 | 3/1993 | Japan . |
| 2005944 | 4/1979 | United Kingdom . |

OTHER PUBLICATIONS

Kuboki, et al., "Design Considerations for Low-Voltage Crystal Oscillator Circuit in a 1.8 V Single Chip Microprocessor", IEICE Transactions on Electronics, VE76-C N5M, May 1993, pp. 701–707.

*Primary Examiner*—David Mis
*Attorney, Agent, or Firm*—Whitham, Curtis, Whitham & McGinn

[57] ABSTRACT

Disclosed herein is an oscillator circuit generating an oscillation signal in response to a resonant element in a first mode and to an external clock signal in a second mode. This oscillator circuit comprises a tri-state inverter circuit and a transfer circuit between the input and output nodes of the tri-state inverter circuit, and the output node of the tri-state inverter circuit is brought into a high impedance condition when an external clock signal is used and into an active state when the resonant element is employed.

4 Claims, 9 Drawing Sheets

OSCILLATOR CIRCUIT GENERATING OSCILLATION SIGNAL RESPONSIVE TO ONE OF RESONANT ELEMENT AND EXTERNAL CLOCK SIGNAL

BACKGROUND OF THE INVENTION

1. Field of the Invention

This invention relates to an oscillator circuit and, more particularly, to an oscillator circuit generating an oscillation signal in response to, in a first mode, a resonant element such as a crystal and, in a second mode, an external clock signal.

2. Description of the Related Art

An example of such a conventional oscillator circuit is shown in FIG. 13. This circuit is constituted of an inverter circuit consisting of a P-type MOSFET M1 and an N-type MOSFET M2 and having an input node connected to a terminal $V_1$ and an output node connected to a terminal $V_2$, a transfer circuit consisting of a P-type MOSFET M3 having its drain connected to the terminal $V_1$ and its source connected to the terminal $V_2$ and an N-type MOSFET M4 having its drain connected to the terminal $V_1$ and its source connected to the terminal $V_2$, an N-type MOSFET M8 connected between the terminal $V_1$ and the ground, an inverter circuit 11 having its input connected to the terminal $V_2$ and its output connected to the output $V_0$ of the oscillator circuit, and an oscillation control circuit consisting of an inverter circuit 12 and a NOR circuit 13. A crystal X1 is optionally connected between the terminal $V_1$ and the terminal $V_2$. In addition, the oscillator circuit includes a stop input signal $V_S$ and a switching input terminal $V_X$ from a data processing unit such as a CPU (not shown).

This circuit operates as a crystal oscillator circuit when both of the oscillation stop input signal $V_S$ and the oscillation switching input signal $V_X$ are at the low level. This is because the N-type MOSFET M8 is turned off and both of the P-type MOSFET M3 and the N-type MOSFET M4 are turned on.

On the other hand, when the signal $V_S$ is at the high level, the N-type MOSFET M8 is turned on because of the high level of its gate, and the transfer circuit is turned off by the shift of the gate of the P-type MOSFET M3 to the high level and the gate of the N-type MOSFET M4 to the low level, which brings the terminal $V_1$ to the low level and the terminal $V_2$ to the high level, stopping the oscillation.

The frequency-gain characteristic of the inverter circuit consisting of the P-type MOSFET M1 and the N-type MOSFET M2 is as shown in FIG. 14(a), so that oscillation is possible at a frequency lower than frequency $f_0$ where the gain becomes 0 dB. Since the frequency $f_0$ varies substantially in proportional to the gate width W of the MOSFET as shown in FIG. 14(b), the frequency $f_0$ has to be selected somewhat higher than a desired oscillation frequency.

Since, however, at that time the consumed current I of the inverter circuit constituted of the P-type MOSFET M1 and the N-type MOSFET M2 is determined by the gate width W of the MOSFET with substantially proportional relation between the consumed current and the gate width as shown in FIG. 14(c), the gate width W should not be taken so large in order to reduce the power consumption. Therefore, a gate width W which gives rise to a frequency $f_0$ slightly higher than the desired frequency is adopted.

In this oscillator circuit, the gain of the inverter circuit consisting of the P-type MOSFET M1 and the N-type MOSFET M2 decreases with the increasing load capacity $C_L$ as shown by the dependence of the load capacity on the gain as given in FIG. 15. When the oscillator circuit is operated for this reason by an external clock signal rather than by the use of the crystal oscillator, the P-type MOSFET M3 and the N-type MOSFET M4 are turned off by bringing the signal $V_X$ of the oscillation control circuit to the high level and an external clock signal $V_C$ is applied to the terminal $V_1$ alone. In that case, the clock signal $V_C$ is transmitted to the interior of the oscillator circuit through the inverter circuit constituted of the P-type MOSFET M1 and the N-type MOSFET M2 and the inverter circuit 11.

If in this case a load capacity $C_L$ exists at the terminal $V_2$ due to wiring pattern or the like in the exterior of the LSI, the gain decreases as shown in FIG. 15, and the external clock signal is attenuated by the inverter circuit constituted of the P-type MOSFET M1 and the N-type MOSFET M2, resulting sometimes in a situation where the transmission of the signal to the interior fails.

Moreover, if the external clock signal $V_C$ is applied to the terminal $V_2$ alone, the output voltage of the P-type MOSFET M1 and the N-type MOSFET M2 competes with the external clock signal $V_C$, and results either in non-transmission of the external clock signal $V_C$ to the interior or a situation in which the MOSFETs become the sources of the noise due to the flow of a high through current.

For this reason, in operating the oscillator circuit by an external clock signal, it would be necessary to externally install an inverter circuit 15 between the terminal $V_1$ and the terminal $V_2$, as shown in FIG. 16.

SUMMARY OF THE INVENTION

It is therefore an object of this invention to provide an oscillator circuit generating oscillation signal in response to a resonant element in a first mode and to an external clock signal without an external inverter circuit as well as large noises in a second mode.

An oscillator circuit according to this invention includes a first terminal, a second terminal, a tri-state inverter circuit having an input node connected to the first terminal and an output node connected to the second terminal, a feedback circuit connected between the first and second terminals, and a control circuit operating in a first mode to activate each of the tri-state inverter circuit and the feedback circuit and in a second mode to deactivate each of the tri-state inverter circuit and the feedback circuit. The tri-state circuit presents, when deactivated, a high impedance state at the output node thereof.

In the first mode, the tri-state inverter cooperates with a resonant element connected between the first and second terminals to generate an oscillation signal. In the second mode, an external clock signal is applied to the second terminal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Figure 1:
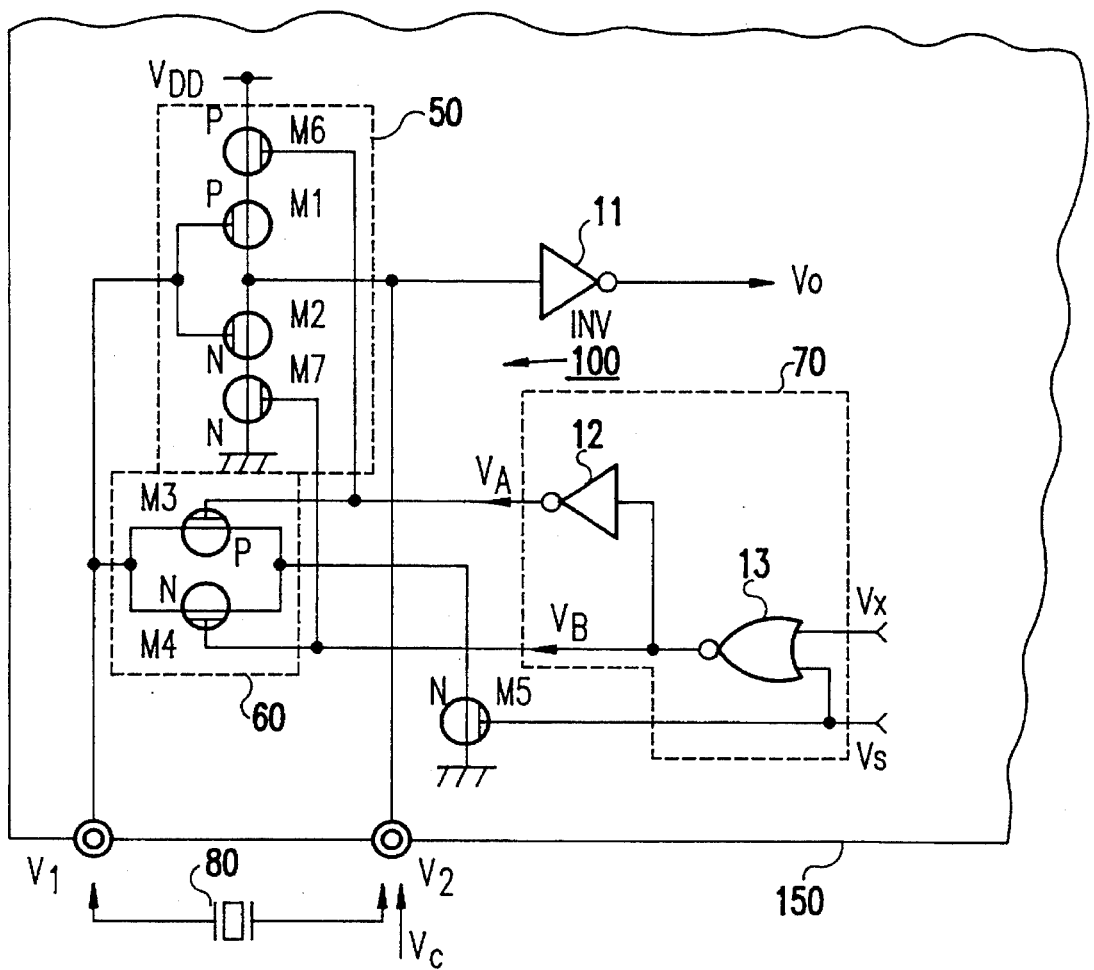
FIG. 1 is a circuit diagram for a first embodiment of this invention.

FIG. 1 is a circuit diagram of an oscillator circuit according to the first embodiment of this invention. This oscillator circuit 100 is fabricated on a single semiconductor chip 150 and includes a tri-state inverter circuit 50 constituted by a serial connection of a P-type MOSFET M6, a P-type MOSFET M1, an N-type MOSFET M2 and an N-type MOSFET M7 between a power line VDD and a ground line and having an input node connected to a terminal $V_1$ and an output node connected to a terminal $V_2$, a transfer circuit 60 as a feedback circuit consisting of a P-type MOSFET M3 and an N-type MOSFET M4, an N-type MOSFET M5 connected between the terminal $V_2$ and the ground, an inverter circuit 11 having an input node connected to the terminal $V_2$ and an output node connected to the output $V_0$ of the oscillator circuit, and an oscillation control circuit 70 consisting of an inverter circuit 12 and a NOR circuit 13. On the outside of the chip 150, a resonant element 80 such as a crystal is connected between the terminals V1 and V2 or an external clock signal $V_C$ is applied to the terminal V2. The oscillation signal derived from the output $V_0$ of the oscillator circuit is supplied to a data processing unit (not shown) on the chip 150.

Next, the operation of this circuit will be described. In a first mode as a crystal oscillator, the crystal 80 is connected between the terminal $V_1$ and the terminal $V_2$. When the terminals $V_S$ and $V_X$ of the oscillation control circuit are both at the low level, the P-type MOSFET M6 and the N-type MOSFET M7 are turned on a activate a tri-state inverter circuit 50, and the P-type MOSFET M3 and the N-type MOSFET M4 are also turned on to serve as a feedback resistor. At this time, the N-type MOSFET M5 is turned off. Accordingly, this circuit 100 performs an operation as a crystal oscillator circuit.

In a second mode as a circuit responsive to an external clock signal, on the other hand, the external clock signal $V_C$ is input to the terminal $V_2$ no crystal is connected between the terminals V1 and V2. At this time, the terminal $V_S$ of the oscillation control circuit 70 assumes the low level and the terminal $V_X$ assumes the high level. Therefore, the P-type MOSFET M6 and the N-type MOSFET M7 are turned off to deactivate the tri-state inverter circuit 50. The output end of the circuit 50 is thereby brought into in the high impedance state. Further, the P-type MOSFET M3 and the N-type MOSFET M4 are both turned off to disconnect the terminal $V_1$ from the terminal $V_2$, and the N-type MOSFET M6 is turned off. As a result, the external clock signal $V_C$ applied to the terminal $V_2$ is transmitted to the interior as the oscillation signal $V_0$ through the inverter 11.

In either first or second mode, when the terminal $V_S$ of the oscillation control circuit assumes the high level, the P-type MOSFET M6 and the N-type MOSFET M7 are turned off to bring the output of the tri-state inverter circuit 50 into the high impedance state, and the P-type MOSFET M3 and the N-type MOSFET M4 are turned off to separate the terminal $V_1$ and the terminal $V_2$ from each other, and further the N-type MOSFET M5 is turned on to clamp the terminal $V_2$ at the low level. As a result, the input to the inverter circuit 11 is clamped at the low level to prevent a through-current flowing therethrough. Further, the oscillation signal $V_0$ is not derived.

In this circuit, the characteristics of the tri-state inverter circuit constituted of the MOSFETs M1, M2, M6 and M7 are the same as those described in connection with the conventional inverter, and the gate width W is adopted which makes the frequency $f_0$ to be slightly higher than the desired frequency, analogous to the conventional case. In that case, the consumed current in the tri-state inverter circuit of this invention is the same as in the conventional inverter circuit if the oscillation frequencies are equal.

In this circuit, during the oscillation using the external clock signal $V_C$, the output of the tri-state inverter circuit constituted of the MOSFETs M6, M1, M2 and M7 goes to the high impedance state, so that it is possible to operate the circuit by just applying the external clock signal $V_C$ to the terminal $V_2$ alone. Furthermore, the potential and the parasitic capacity of the terminal $V_1$ at that time will not affect the characteristics of the oscillator circuit.

Moreover, when using an oscillator circuit operated by an external clock signal, there is also an advantage that the terminal $V_1$ can be used as an input terminal or an output terminal for a signal unrelated to the oscillator circuit.

As described in the above, by eliminating an externally installed inverter circuit, the oscillator circuit according to this invention makes it possible to reduce the cost, the layout area and the power consumption of the inverter circuit compared with the conventional oscillator circuit.

Figure 2:
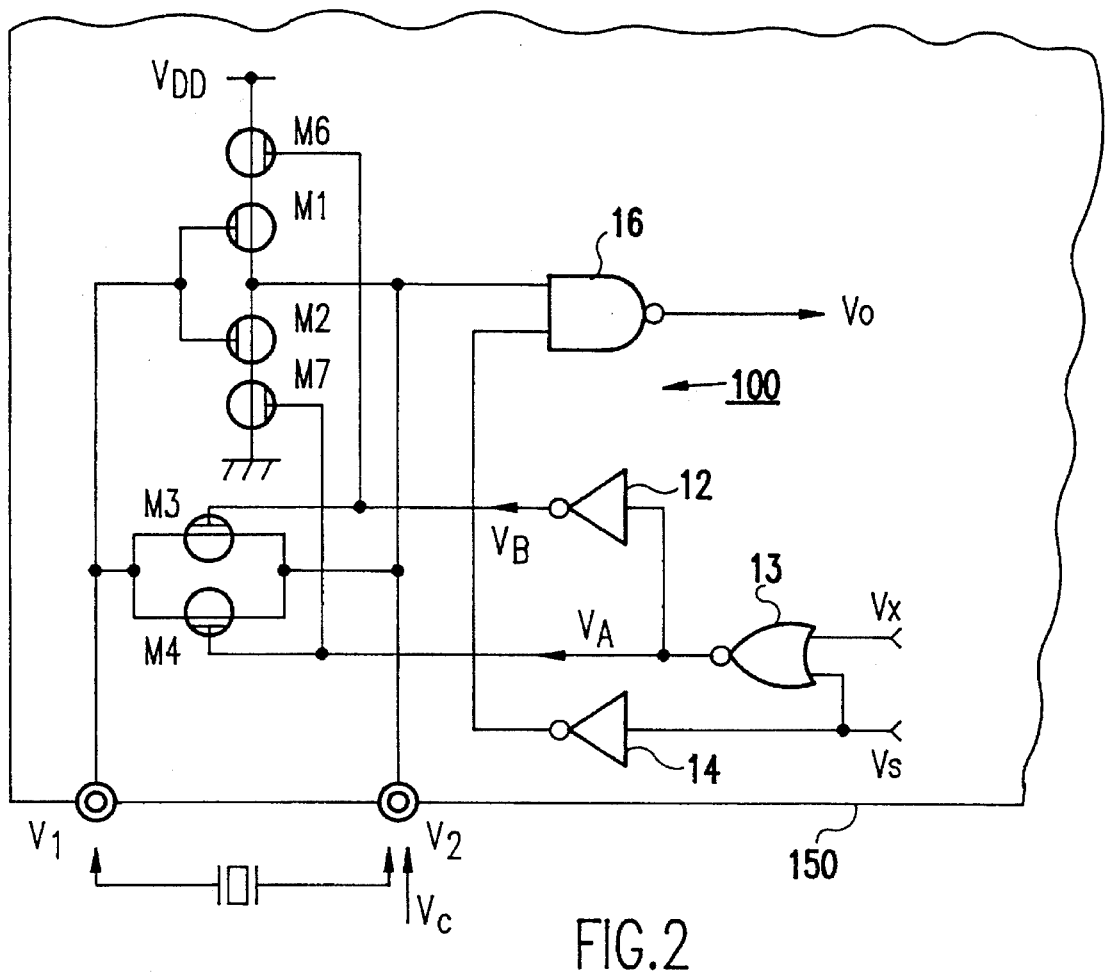
FIG. 2 is a circuit diagram for a second embodiment of this invention.

Turning to FIG. 2, there is shown a circuit diagram of the second embodiment in which the same constituents as those shown in FIG. 1 are denoted by the same reference numerals to omit the further description thereof. This circuit is obtained by deleting the N-type MOSFET M5 and replacing the inverter circuit 11 with a NAND circuit 16. With this circuit, effects similar to those of the embodiment in FIG. 1 can be obtained. In addition, in contrast to the necessity in the first embodiment for the external clock signal to be at the low level in stopping the oscillation, in order to conform with the low level of the terminal $V_2$ at the time of oscillation stop, the potential of the terminal $V_2$ at the oscillation stop is not fixed in this embodiment and an arbitrary input potential can be adopted.

In these oscillator circuits of the first and the second embodiments, it is necessary to have determined, immediately after turn-on of the power supply, whether the circuit is to be operated by using the crystal oscillator or by the external clock signal. Therefore, it is necessary to indicate the choice by providing a dedicated terminal on the chip 150. In connection with the provision for the dedicated terminal, there would take place such problems as the cost increase due to increase in the number of package pins and the number of pads on the chip, and the preparation of switching signals.

Figure 3:
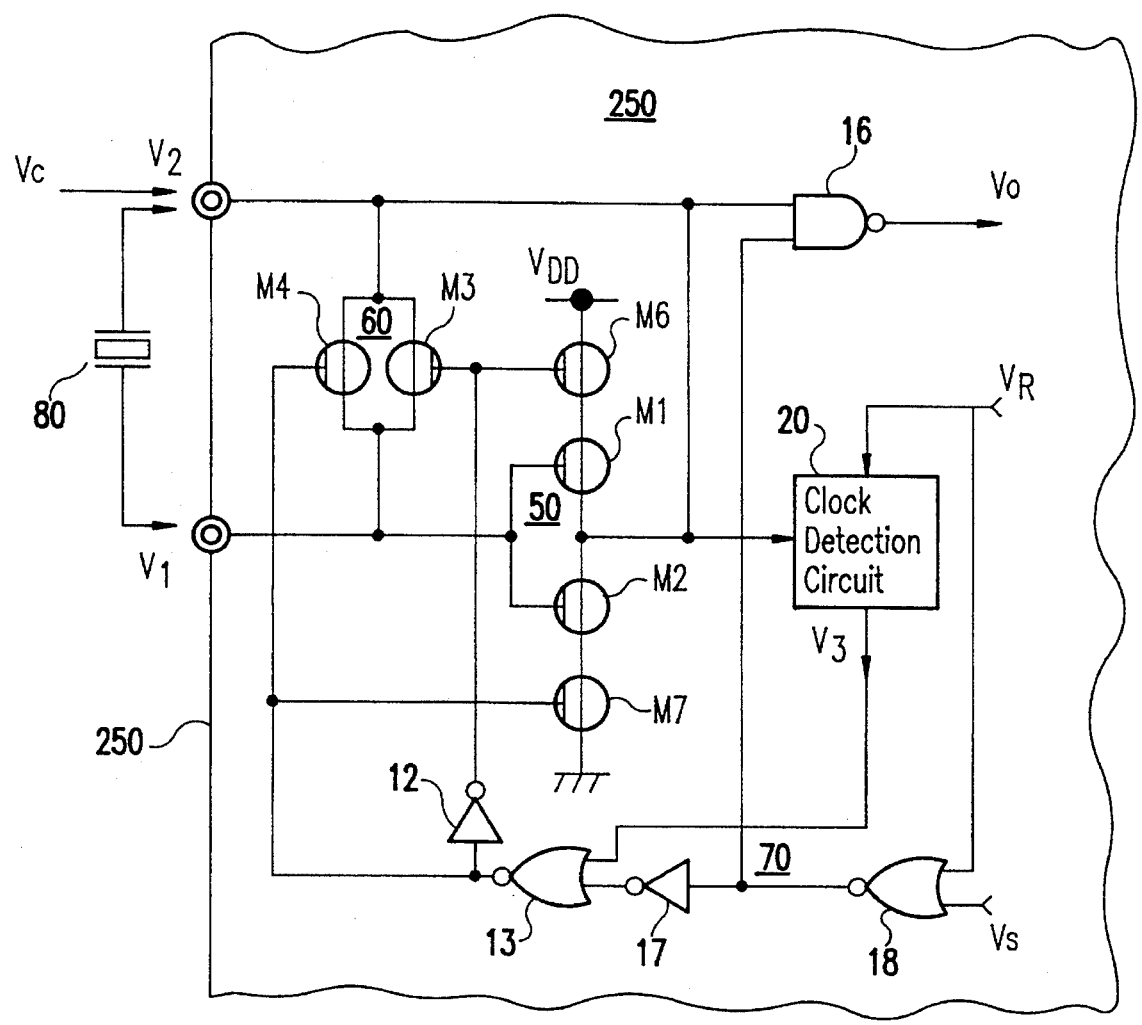
FIG. 3 is a circuit diagram for a third embodiment of this invention.

An oscillation circuit for the purpose of solving these problems are therefore shown in FIG. 3 as the third embodiment of this invention. This oscillator circuit 200 is fabricated on a single semiconductor chip 250 and includes a tri-state inverter circuit 50 formed of a series connection of P-type MOSFETs M1 and M6 and N-type MOSFETs M2 and M7 and having an input node connected to a terminal $V_1$ and an output node connected to a terminal $V_2$, a transfer circuit 60 as a feedback circuit formed by a P-type MOSFET M3 and an N-type MOSFET M4 connected in parallel between the terminal $V_1$ and the terminal $V_2$, a NAND circuit 16 having a first input connected to the terminal $V_2$ and an output connected to the output $V_0$ of the oscillator circuit, a clock detection circuit 20 having first and second inputs connected to the terminals $V_2$ and $V_R$, and an oscillation control circuit 70 consisting of inverter circuits 12 and 17 and NOR circuits 13 and 18.

Figure 4:
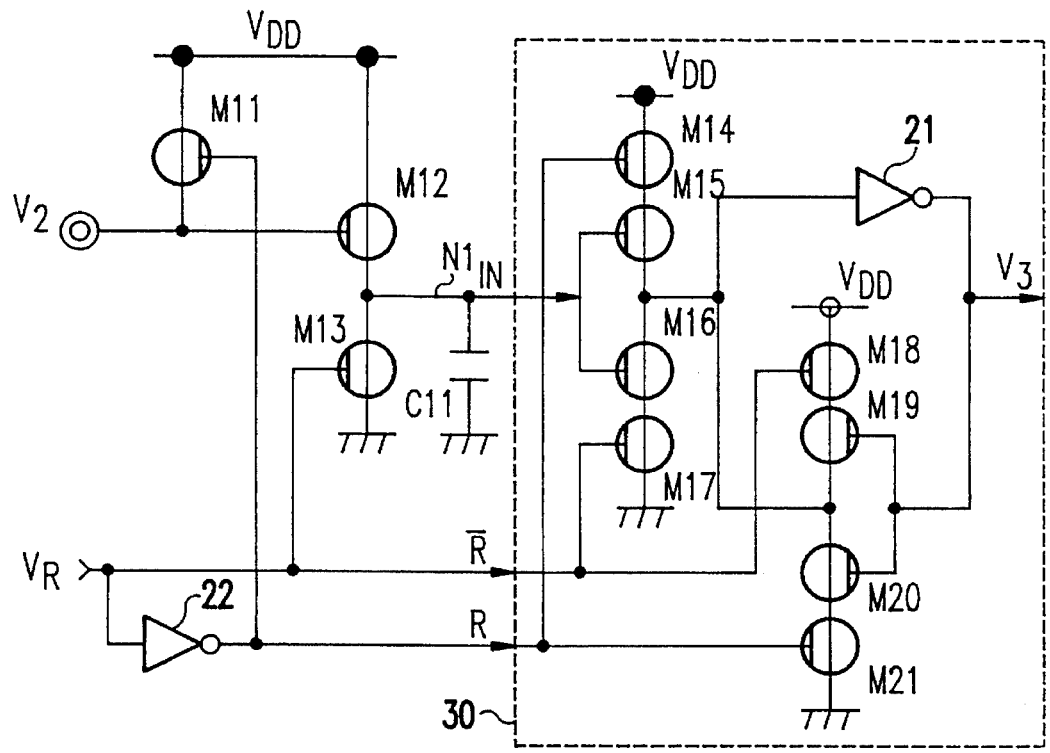
FIG. 4 is a circuit diagram for a clock detection circuit shown in FIG. 3.

FIG. 4 is a circuit diagram for an example of the clock detection circuit in FIG. 3. This clock detection circuit is constituted of a P-type MOSFET M11 connected between the terminal $V_2$ and a power supply $V_{DD}$, a P-type MOSFET M12 having its drain connected to a junction N1, its gate connected to the terminal $V_2$ and its source connected to the power supply $V_{DD}$, an N-type MOSFET M13 having its drain connected to the junction N1, its gate connected to the terminal $V_R$ and its source connected to the ground potential, a capacitance element C11 connected between the junction N1 and the ground potential, a latch circuit 30 constituted of a tri-state inverter circuit consisting of P-type MOSFETs M14 and M15 and N-type MOSFETs M16 and M17, and a tri-state inverter circuit consisting of P-type MOSFETs M18 and M19 and N-type MOSFETs M20 and M21, having its input at the junction N1 and its output at a terminal $V_3$, and an inverter circuit 22.

Figure 5:
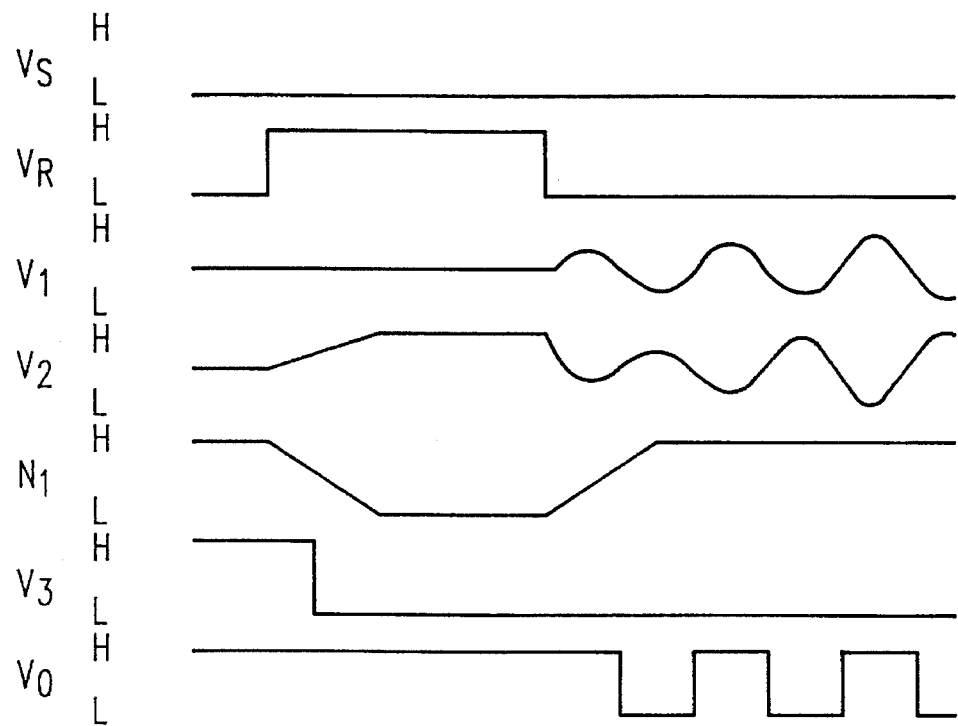
FIG. 5 is a signal waveform diagram for describing the operation of the circuit shown in FIG. 3.

The operation of this circuit will be described. First, in the case of oscillation using a crystal oscillator in which a crystal 80 as a resonant element is connected between the terminals $V_1$ and $V_2$, the operation of the circuit is shown by the waveforms given in FIG. 5. In starting an LSI, it is general to use a reset signal $V_R$ to initialize the internal circuit. In that case, when the reset signal $V_R$ goes to the high level in the oscillator circuit, the output of the tri-state inverter circuit constituted of the MOSFETs M1, M2, M6 and M7 goes to the high impedance state, the transfer circuit constituted of the MOSFETs M3 and M4 is turned off, the tri-state inverter circuit constituted of the MOSFETs M14 to M17 operates as an inverter, the output of the tri-state inverter circuit constituted of the MOSFETs M18 to M21 goes to the high impedance state, and the MOSFETs M11 and M13 are turned on.

Since the terminal $V_2$ is connected only to the crystal oscillator and has no dc current path, the terminal $V_2$ is sent to the high level by the MOSFET M11, which turns off the MOSFET M12 and brings the junction N1 to the low level, and the terminal $V_3$ is brought to the low level.

As the reset signal $V_R$ returns to the low level later, the low level of the terminal $V_3$ is latched and the tri-state inverter circuit consisting of the MOSFETs M1, M2, M6 and M7 operates as an ac amplifier, the transfer circuit consisting of the MOSFETs M3 and M4 is turned on to a start the crystal oscillation operation, and the signal at the terminal $V_2$ is output to the terminal $V_0$ through the NAND circuit 16.

Figure 6:
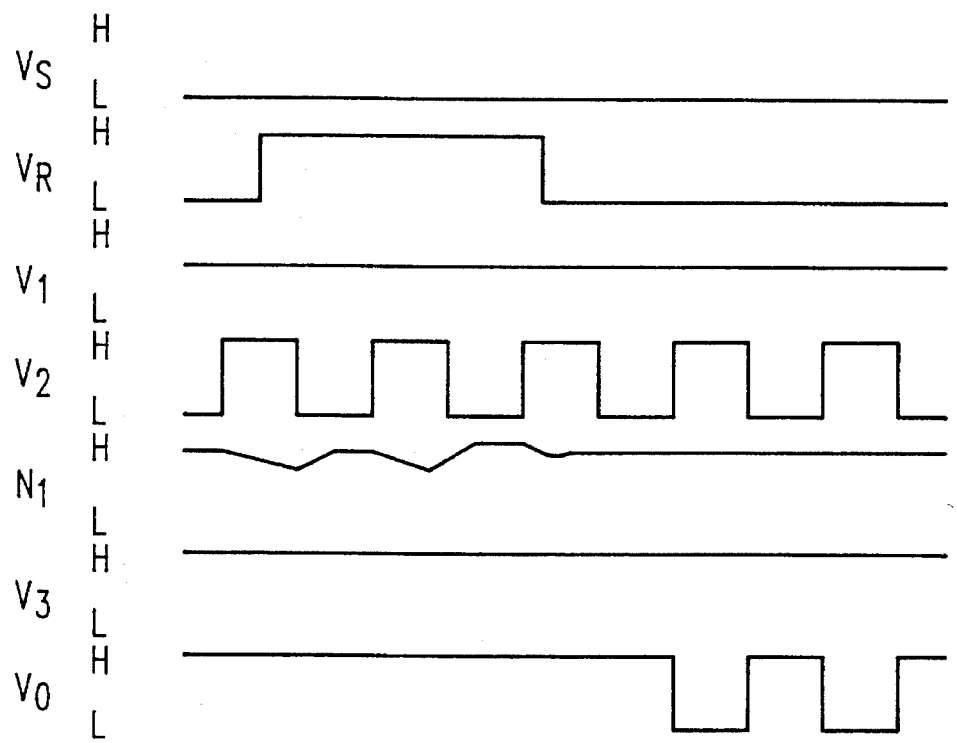
FIG. 6 is another signal waveform diagram for describing the operation of the circuit shown in FIG. 3.

Next, the operation by receiving an external clock signal $V_C$ at the terminal $V_2$ is shown by the waveform diagram in FIG. 6. As the reset signal $V_R$ goes to the high level the output of the tri-state inverter circuit consisting of the MOSFETs M1, M2, M6 and M7 goes to the high impedance state, the transfer circuit consisting of the MOSFETs M3 and M4 is turned off, the tri-state inverter circuit consisting of the MOSFETs M14 to M17 operates as an inverter, the output of the tri-state inverter circuit consisting of the MOSFETs M18 to M21 goes to the high impedance state, and the MOSFETs M11 and M13 are turned on.

Here, the on-resistance of the MOSFET M11 is set to be sufficiently high compared with the internal resistance of the source (not shown) of the external clock signal $V_C$, so that the voltage of the terminal $V_2$ oscillates in the same way as the external clock signal does, by which the MOSFET M12 repeats the on-and-off operation and charges up the capacitance element C11.

By setting the mutual conductance of the MOSFET M13 to be sufficiently small compared with the mutual conductance of the MOSFET M12, and restricting the charge discharged by M13 to be small compared with the charge accumulated in C11, the junction N1 goes substantially to the high level and the terminal $V_3$ goes to the high level when a clock signal is input to the terminal $V_2$ from the outside.

When the reset signal $V_R$ returns to the low level later, the high level of the terminal $V_3$ is latched, and the signal at the terminal $V_2$ is transmitted to the output VO of the oscillator circuit via the NAND circuit 16, while keeping the output of the tri-state inverter circuit consisting of the MOSFETs M1, M2, M6 and M7 in the high impedance state, and while keeping the transfer circuit consisting of the MOSFETs M3 and M4 turned off.

As in the above, this embodiment obviates the signal for switching between the oscillation by means of an external clock signal and the oscillation by means of a crystal oscillator, and as a result of that it is possible to reduce the number of the signal pins and the bonding pads.

It should be mentioned that the NAND circuit 16 employed in this embodiment is frequently that of the Schmitt type in order to eliminate malfunctions of the oscillator circuit output caused by the noise generated at the terminal $V_2$.

Figure 7:
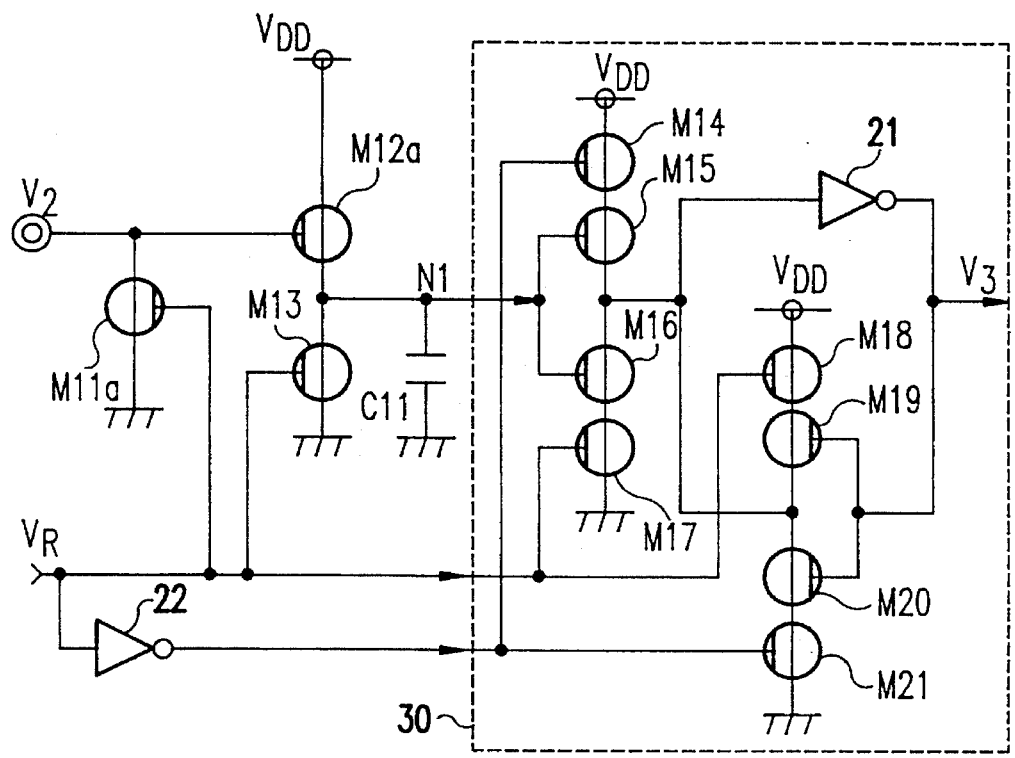
FIG. 7 is a circuit diagram for another example of a clock detection circuit shown in FIG. 3.

Another example of the clock detection circuit 20 is shown in FIG. 7. This circuit is obtained from the circuit in FIG. 4 by replacing the P-type MOSFET M12 by an N-type MOSFET M12a and the P-type MOSFET M11 by an N-type MOSFET M11a and connecting them between the terminal $V_2$ and the ground potential.

Figure 8:
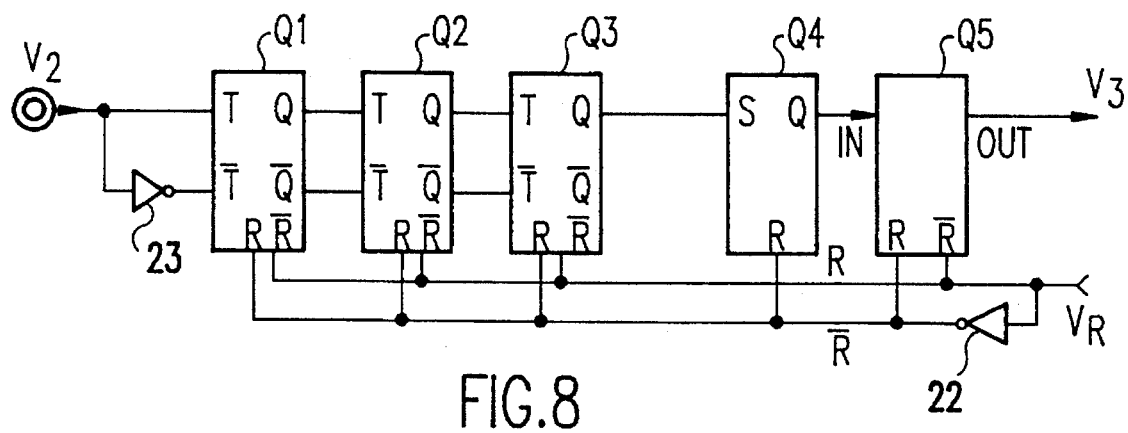
FIG. 8 is a circuit diagram of a clock detection circuit for a fourth embodiment of this invention.
Figure 9:
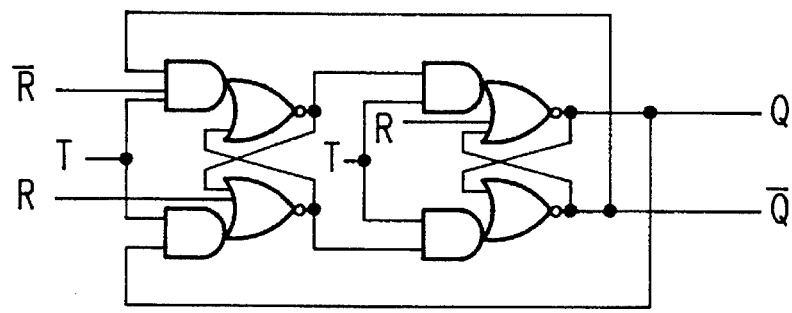
FIG. 9 is a circuit diagram of the T-type flip-flop shown in FIG. 8.
Figure 10:
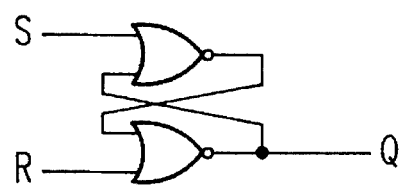
FIG. 10 is a circuit diagram of the R-S flip-flop shown in FIG. 8.

FIG. 8 is a circuit diagram for the fourth embodiment of this invention, which is another block diagram for the clock detection circuit in FIG. 3. An example of the circuit diagram for the T-type flip-flops Q1 to Q3 of this embodiment is shown in FIG. 9, an example of the circuit diagram for the RS flip-flop Q4 is shown in FIG. 10, and as an example of a latch circuit Q5 use is made of the latch circuit 30 shown in FIG. 4.

This circuit counts signals input to the terminal $V_2$ with a binary counter constituted of three T-type flip-flop circuits Q1 to Q3, and when the output end Q of Q3 goes to the high level, the signal is latched by the RS flip-flop Q4 and the latch circuit Q5 in the next stage.

Figure 11:
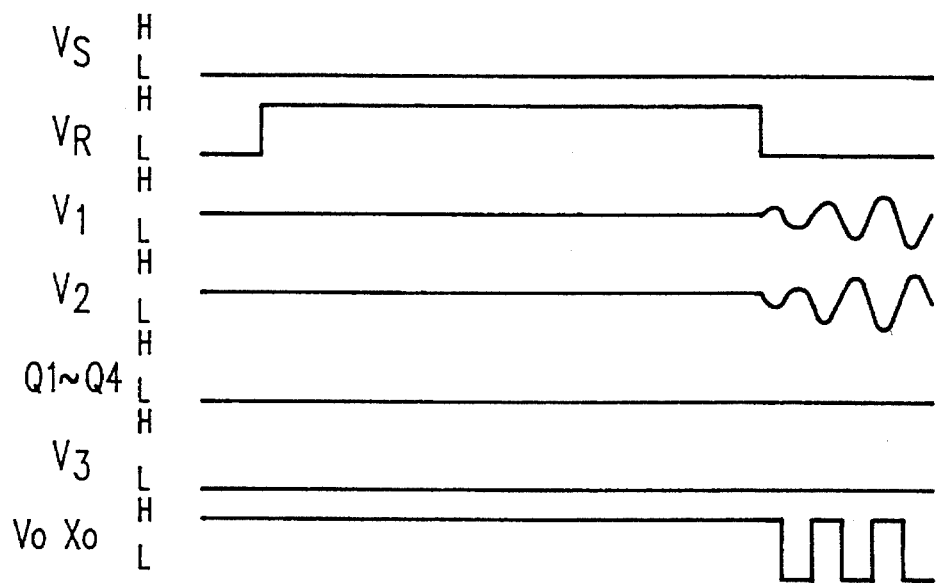
FIG. 11 is a signal waveform diagram for describing the operation of the circuit shown in FIG. 8.

In the case of oscillation by means of a crystal oscillator, the crystal oscillator is connected between the terminal $V_1$ and the terminal $V_2$. The operation in that case is shown in FIG. 11. As the reset signal goes to the high level, the output of the tri-state inverter circuit consisting of the MOSFETs M1, M2, M6 and M7 goes to the high impedance state, and the transfer circuit consisting of the MOSFETs M3 and M4 is turned off.

Since the terminal $V_2$ is connected to the crystal oscillator alone and the potential of $V_2$ undergoes no variation, the counter is not actuated, with the flip-flop Q3 remaining at the low level, and the terminal $V_3$ goes to the low level. When the reset signal $V_R$ returns to the low level later, the low level of the terminal $V_3$ is latched, the tri-state inverter circuit operates as an ac amplifier, the transfer circuit consisting of the MOSFETs M3 and M4 is turned on, the crystal oscillator starts operation, and the signal at the terminal $V_2$ is output to the terminal $V_0$ through the NAND circuit 16.

Figure 12:
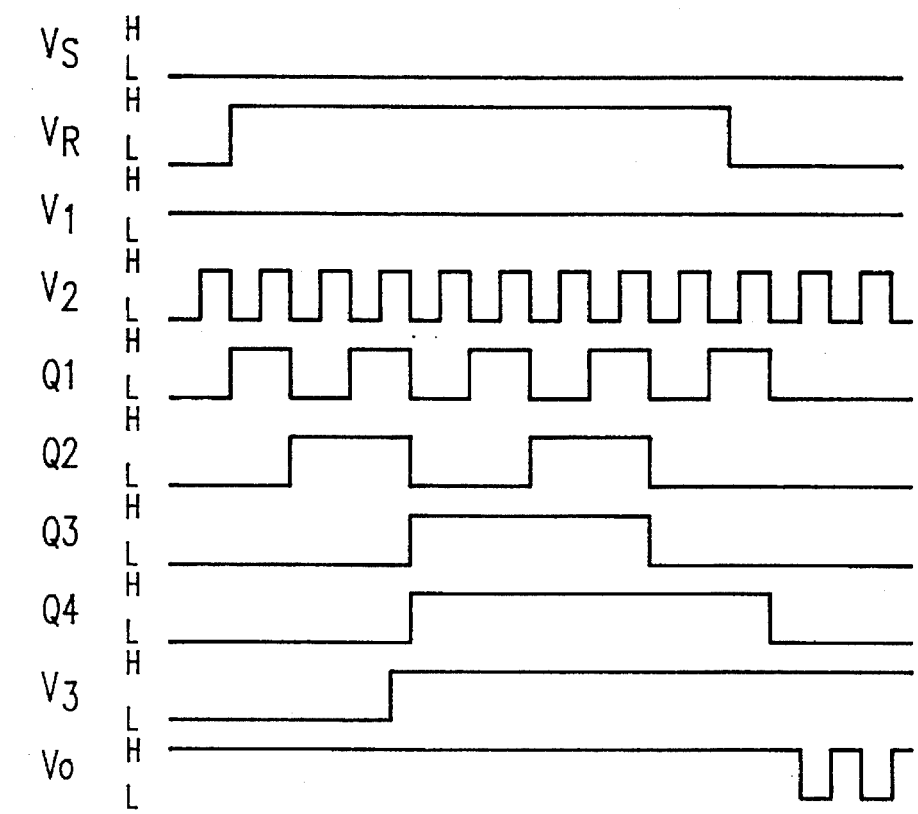
FIG. 12 is another signal waveform diagram for describing the operation of the circuit shown in FIG. 8.
Figure 13:
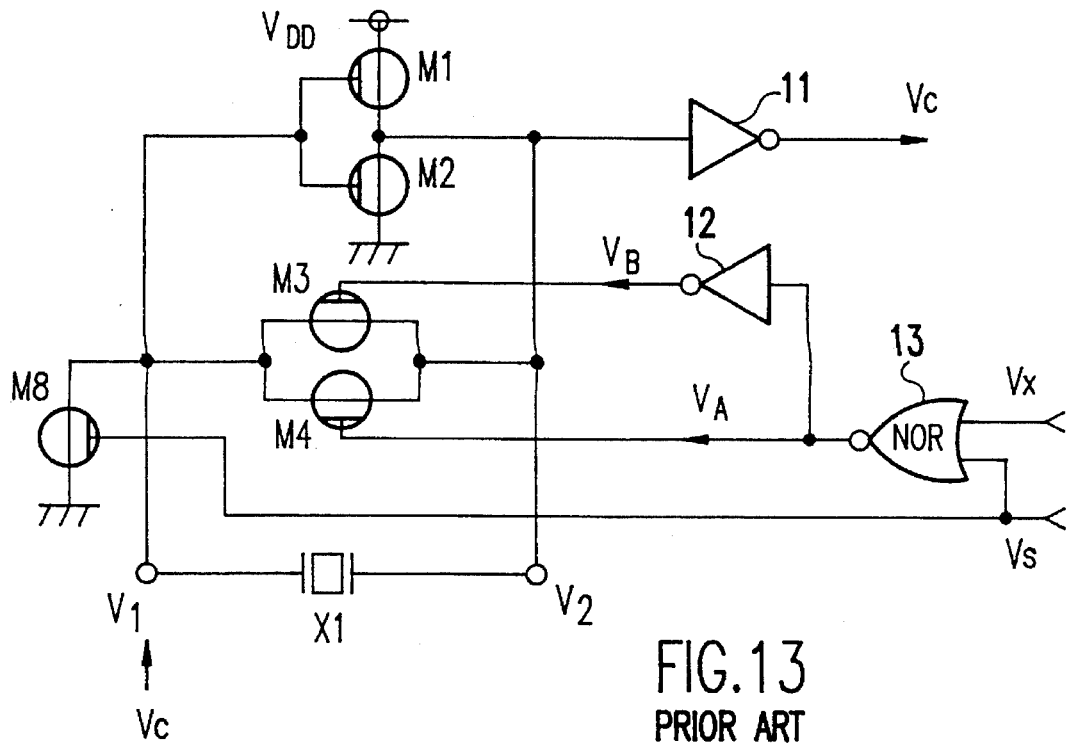
FIG. 13 is a circuit diagram for a conventional oscillator circuit.
Figure 16:
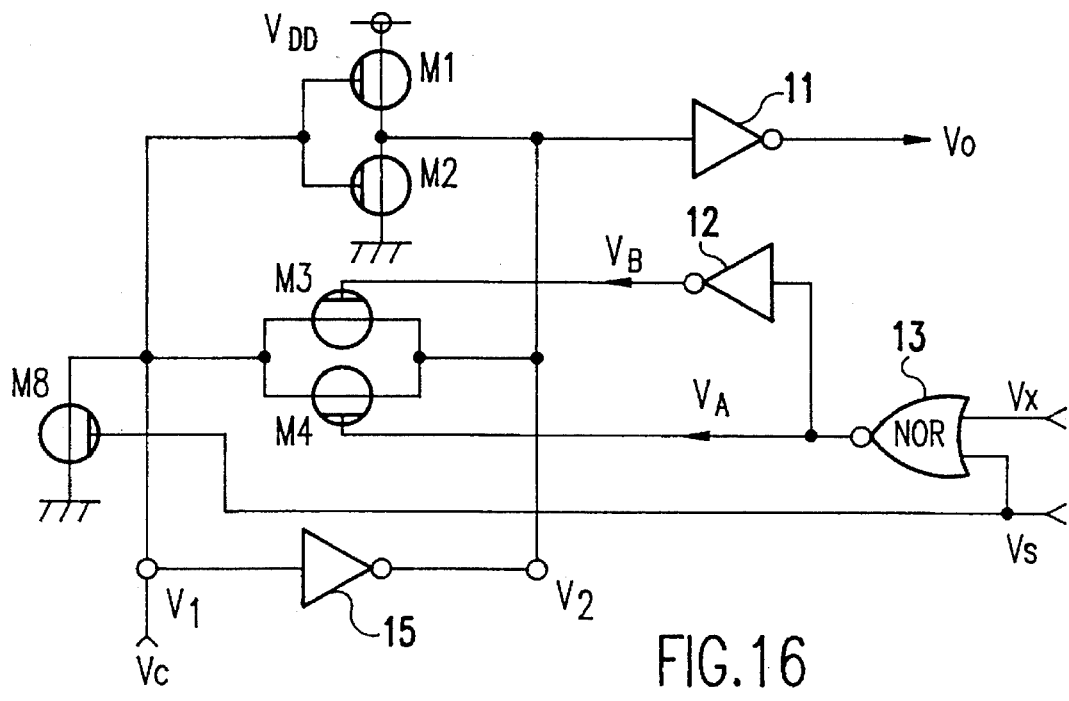
FIG. 16 is a circuit diagram for another example of the conventional oscillator circuit.
Figure 14A:
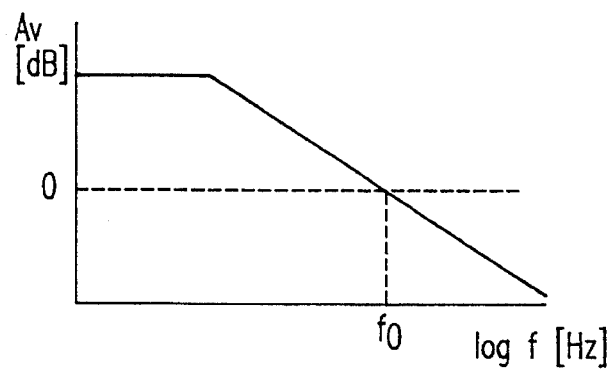
FIGS. 14(a–c) are diagrams showing the characteristics of the inverter circuit.
Figure 14B:
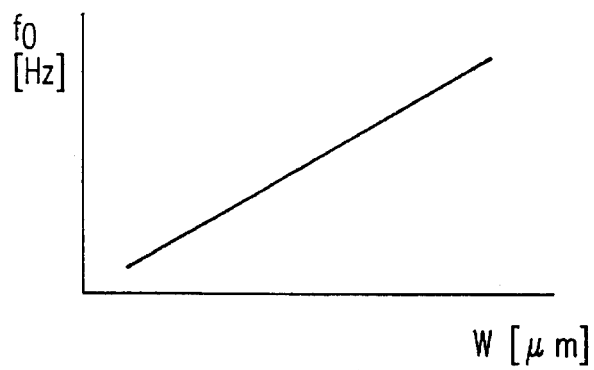
Figure 14C:
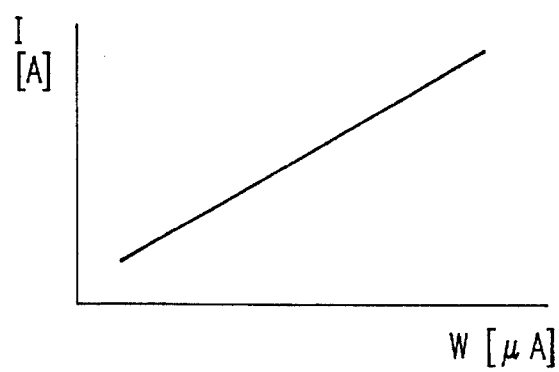
Figure 15:
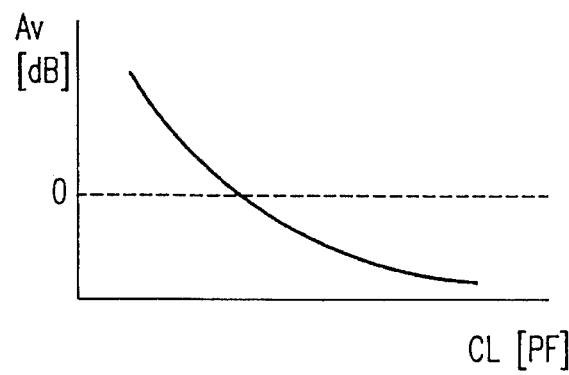
FIG. 15 is a diagram showing a characteristic of the inverter circuit.

Next, in the case of oscillation by means of an external clock signal, a clock signal is applied from the outside to the terminal $V_2$. The operation for this case is shown in FIG. 12. As the reset signal $V_R$ goes to the high level the output of the tri-state inverter circuit including the MOSFETs M1 and M2 goes to the high impedance state, and the transfer circuit consisting of the MOSFETs M3 and M4 is turned off. Then, the counter circuit consisting of Q1, Q2 and Q3 starts counting, and when the flip-flop Q3 goes to the high level, the terminal $V_3$ goes to the high level. When the reset signal $V_R$ returns to the low level later, the high level of Q3 is latched, and the signal at the terminal $V_2$ is transmitted to the output VO of the oscillator circuit through the NAND circuit 16 while keeping the output of the tri-state inverter circuit including the MOSFETs M1 and M2 in the high impedance state, and while keeping the transfer circuit consisting of the MOSFETs M3 and M4 turned off.

As described in the above, effects similar to the cases of other embodiments can be obtained by this embodiment. Moreover, signals are processed in the logic circuit so that it is possible to carry out clock detection without being affected by the duty cycle of the external clock signal input from the terminal $V_2$.

As in the above, this invention utilizes the inverter circuit which is an ac amplifier as a tri-state inverter circuit, and devised a scheme to convert its output to the high impedance state. Therefore, when using an external clock signal, the necessity for inputting inverted signals to the two input terminals can be obviated, so that there is an effect that an inverter circuit for preparing the inverted signals can be eliminated and that noise generation can be suppressed.

Moreover, when a clock detection circuit is provided, it is possible to automatically switch between the external clock operation mode and the crystal oscillation mode by means of the output signal of the detection circuit. Therefore, there is an additional effect that the number of pins and bonding pads for the preparation of the switching signal can be reduced, and makes the switching signal from the outside unnecessary.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. An oscillator circuit comprising a first terminal, a second terminal, a tri-state inverter circuit having an input node coupled to said first terminal, and an output node coupled to said second terminal, a feedback circuit coupled between said first and second terminals, a detection circuit coupled to said second terminal for detecting whether said second terminal is connected with a resonant element or said second terminal receives a clock signal, and for producing a detection signal, said detection signal taking a first level when said second terminal is connected with said resonant element and a second level when said second terminal receives said clock signal, and a control circuit activating each of said tri-state inverter circuit and said feedback circuit in response to said first level of said detection signal and deactivating each of said tri-state inverter circuit and said feedback circuit in response to said second level of said detection signal.

2. The circuit as claimed in claim 1, wherein said detection circuit includes a capacitor, means responsive to said second terminal being connected to said resonant element for discharging said capacitor to produce said detection signal taking said first level, and means responsive to said second terminal receiving said clock signal for charging said capacitor to produce said detection signal taking said second level.

3. The circuit as claimed in claim 2, wherein said detection circuit further includes a bi-stable circuit which is brought into a first state by discharging said capacitor and into a second state by charging said capacitor, said detection signal taking said first level by said first state of said bi-stable circuit and said second level by said second state of said bi-stable circuit.

4. The circuit as claimed in claim 1, wherein said detection circuit including a counter counting changes in level at said second terminal to produce said detection signal taking one of said first and second levels.

* * * * *